(12) United States Patent
Jung

(10) Patent No.: US 10,642,415 B2
(45) Date of Patent: *May 5, 2020

(54) TOUCH SCREEN DEVICE INCLUDING A CONTROLLER TO ADJUST A SENSING PARAMETER BASED ON ACCUMULATIVE FOLDING, DISPLAY DEVICE HAVING THE SAME, AND METHOD OF DRIVING THE SAME

(71) Applicant: SAMSUNG DISPLAY CO., LTD., Yongin-si, Gyeonggi-do (KR)

(72) Inventor: Chan-Sung Jung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/286,768

(22) Filed: Feb. 27, 2019

(65) Prior Publication Data
US 2019/0187858 A1    Jun. 20, 2019

Related U.S. Application Data

(63) Continuation of application No. 15/357,254, filed on Nov. 21, 2016, now Pat. No. 10,222,901.

(30) Foreign Application Priority Data

Nov. 27, 2015    (KR) .................... 10-2015-0167174

(51) Int. Cl.
*G06F 3/041*    (2006.01)
*G06F 3/044*    (2006.01)
(Continued)

(52) U.S. Cl.
CPC ............ *G06F 3/0416* (2013.01); *G06F 3/044* (2013.01); *G06F 3/0418* (2013.01);
(Continued)

(58) Field of Classification Search
CPC ........ G06F 3/044; G06F 3/041; G06F 3/0412; G06F 3/0416; G06F 3/0418;
(Continued)

(56) References Cited

U.S. PATENT DOCUMENTS

| 2010/0117975 A1 | 5/2010 | Cho |
| 2011/0134145 A1 | 6/2011 | Moriwaki |
(Continued)

FOREIGN PATENT DOCUMENTS

KR    10-2010-0052227 A    5/2010

*Primary Examiner* — Darlene M Ritchie
(74) *Attorney, Agent, or Firm* — Lewis Roca Rothgerber Christie LLP

(57) ABSTRACT

A touch screen device includes a touch panel, a touch driver, a touch sensing driver, and a controller. The touch panel includes a plurality of driving lines extending in a first, direction and a plurality of sensing lines extending in a second direction. The touch driver outputs a driving signal to the driving lines. The touch sensing driver receives a sensing signal from the sensing lines. The controller determines a sensing parameter corresponding to an accumulative folding number of the touch panel and controls the touch driver and the touch sensing driver based on the sensing parameter.

10 Claims, 8 Drawing Sheets

(51) Int. Cl.
 *H01L 51/00* (2006.01)
 *G06F 1/16* (2006.01)

(52) U.S. Cl.
 CPC .. *G06F 1/1652* (2013.01); *G06F 2203/04102* (2013.01); *G09G 2380/02* (2013.01); *H01L 51/0097* (2013.01); *H01L 2251/5338* (2013.01)

(58) Field of Classification Search
 CPC ......... G06F 2203/04102; G06F 1/1652; H01L 2251/5338; H01L 51/0097; G09G 2380/02
 See application file for complete search history.

(56) References Cited

U.S. PATENT DOCUMENTS

| | | |
|---|---|---|
| 2013/0265260 A1 | 10/2013 | Seo et al. |
| 2014/0028596 A1 | 1/2014 | Seo et al. |
| 2014/0055429 A1 | 2/2014 | Kwon et al. |
| 2014/0078047 A1 | 3/2014 | Seo et al. |
| 2014/0204285 A1 | 7/2014 | Jang |
| 2015/0169091 A1 | 6/2015 | Ho et al. |
| 2015/0309628 A1* | 10/2015 | Chen ................. G02F 1/133305 428/68 |
| 2017/0060283 A1 | 3/2017 | Sohn et al. |
| 2017/0147117 A1 | 5/2017 | Song et al. |
| 2018/0046287 A1 | 2/2018 | Wada et al. |

\* cited by examiner

TOUCH SCREEN DEVICE INCLUDING A CONTROLLER TO ADJUST A SENSING PARAMETER BASED ON ACCUMULATIVE FOLDING, DISPLAY DEVICE HAVING THE SAME, AND METHOD OF DRIVING THE SAME

CROSS REFERENCE TO RELATED APPLICATIONS

This is a continuation application based on pending application Ser. No. 15/357,254 filed Nov. 21, 2016, the entire contents of which is hereby incorporated by reference.

Korean Patent Application No. 10-2015-0167174, filed on Nov. 27, 2015, and entitled, "Touch Screen Device, Display Device Having the Same, and Method of Driving the Same," is incorporated by reference herein in its entirety.

BACKGROUND

1. Field

One or more embodiments described herein relate to a touch screen device, and a display device having a touch screen device, and a method for driving a touch screen device.

2. Description of the Related Art

Many display devices have touch panels for detecting a touched position on a screen. A variety of touch panels have been developed. Examples include capacitive touch panels, resistive touch panels, and light sensing touch panels. A capacitive touch panel detects capacitance changes caused when an external electric conductor (e.g., a finger or stylus) touches the screen. The location of the capacitance change is linked to functionality of the display or host device. Capacitive touch panels have proven to be suitable for accurate detection of multi-touches and have high touch sensitivity.

Flexible touch screen devices have recently been developed. The touch panel of a flexible touch screen device may include flexible electrodes bonded to a flexible display device. The number of times the touch panel is folded or flexed (e.g., folding number) may affect resistance of the flexible electrodes. This, in turn, may cause the touch screen device to malfunction.

SUMMARY

In accordance with one or more embodiments, a touch screen device includes a touch panel including a plurality of driving lines extending in a first direction and a plurality of sensing lines extending in a second direction; a touch driver to output a driving signal to the driving lines; a touch sensing driver to receive a sensing signal from the sensing lines; and a controller to determine a sensing parameter corresponding to an accumulative folding number of the touch panel and to control the touch driver and the touch sensing driver based on the sensing parameter.

The sensing parameter may include at least one of a voltage of the driving signal, a frequency of the driving signal, a sequence data of the driving signal, a converting gain value of the sensing signal, or a touch threshold value of the sensing signal. The controller may include a change value calculator to calculate a resistance change value based on the accumulative folding number of the touch panel; a parameter deriver to derive the sensing parameter corresponding to the resistance change value; and a control signal generator to generate a control signal for controlling the touch driver and the touch sensing driver based on the sensing parameter.

The change value calculator may calculate the resistance change value by an accumulative sum of folding angles of the touch panel. A voltage of the driving signal may increase as the resistance change value increases. A frequency of the driving signal may decrease as the resistance change value increases. A number of the driving lines in which the driving signal is simultaneously output may increase as the resistance change value increases.

The parameter deriver may derive the sensing parameter corresponding to the resistance change value using a look-up table (LUT), and the LUT may indicate a relationship between the resistance change value and the sensing parameter. The parameter deriver may periodically update the sensing parameter. The touch screen device may include one or more folding sensors to sense a folding state of the touch panel. The touch panel may be folded along at least one folding line and the folding sensors may be symmetrically disposed relative to the folding line. The folding sensor may be an acceleration sensor to measure a folding angle of the touch panel.

In accordance with one or more other embodiments, a display device may include a display panel including a plurality of pixels; a touch panel bonded to one side of the display panel, the touch panel including a plurality of driving lines extending in a first direction and a plurality of sensing lines extending in a second direction; a scan driver to provide a scan signal to the pixels; a data driver to provide a data signal to the pixels; a touch driver to output a driving signal to the driving lines; a touch sensing driver to receive a sensing signal from the sensing lines; and a controller to determine a sensing parameter corresponding to an accumulative folding number of the touch panel and to control the touch driver and the touch sensing driver based on the sensing parameter.

In accordance with one or more other embodiments, a method for driving a touch screen device folded in at least one folding line includes calculating a resistance change value based on an accumulative folding number of a touch panel; determining a sensing parameter corresponding to the resistance change value; and generating a control signal to control a touch driver outputting a driving signal for driving the touch panel and a touch sensing driver receiving a sensing signal for sensing a touch of the touch panel based on the sensing parameter.

The sensing parameter may include at least one of a voltage of the driving signal, a frequency of the driving signal, a sequence data of the driving signal, a converting gain value of the sensing signal, or a touch threshold value of the sensing signal. The method may include calculating the resistance change value based on an accumulative sum of folding angles of the touch panel. A voltage of the driving signal may increase as the resistance change value increases. A frequency of the driving signal may decrease as the resistance change value increases. The method may include determining the sensing parameter using a look-up table (LUT), wherein the LUT indicates a relationship between the resistance change value and the sensing parameter. The method may include periodically updating the sensing parameter.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
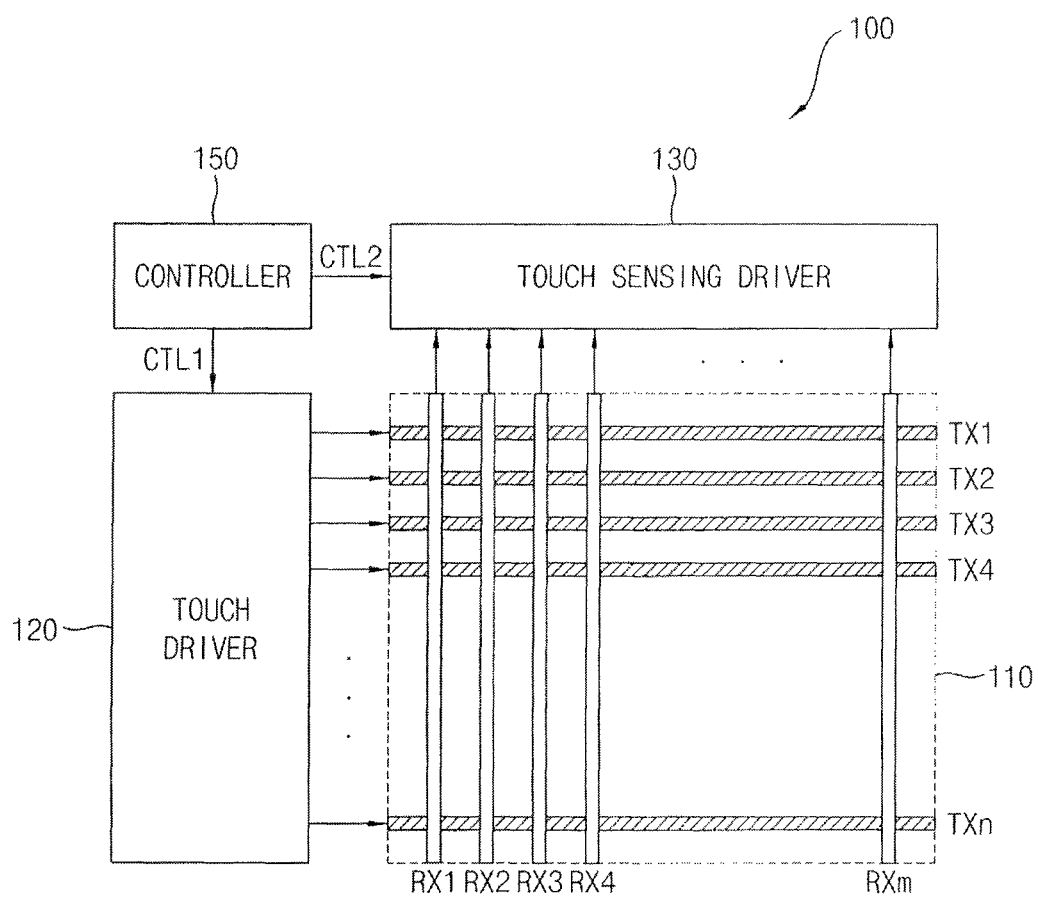
FIG. 1 illustrates an embodiment of a touch screen device.
Figure 1:
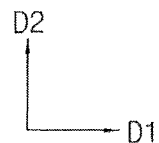

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments may be combined to form additional embodiments.

In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates an embodiment of a touch screen device which may include a touch panel 110, a touch driver 120, a touch sensing driver 130, and a controller 150. The touch panel 110 may include a plurality of driving lines TX1 through TXn extending in a first direction D1 and a plurality of sensing lines RX1 through RXm extending in a second direction D2. The touch panel 110 may be a flexible touch panel that folds or flexes. The driving lines TX1 through TXn and the sensing lines RX1 through RXm may include flexible material. For example, the driving lines TX1 through TXn and the sensing lines RX1 through RXm may include at least one of indium tin oxide (ITO), carbon nano tube (CNT), or silver nanowire (AgNW). In one example embodiment, the touch panel 110 may be folded along at least one folding line.

In one example embodiment, the touch panel 110 may be, for example, a capacitive touch panel. When an external electric conductor (e.g., a finger or stylus) touches the touch panel 110, the capacitance of crossing points of the driving lines TX1 through TXn and sensing lines RX1 through RXm corresponding to a touched position may change. Accordingly, the touch screen device 100 may derive coordinates of the touched position based on change of a sensing signal corresponding to the capacitance.

The touch driver 120 may output a driving signal to the driving lines TX1 through TXn. For example, the touch driver 120 may progressively output the driving signal (which has, for example, at least one pulse) to the driving lines TX1 through TXn. The touch driver 120 may adjust the voltage of the driving signal or the frequency of the driving signal based on the first control signal CTL1, in order to stably secure the charging time for the capacitance of crossing points of the driving lines TX1 through TXn and the sensing lines RX1 through RXm.

The touch sensing driver 130 may receive a sensing signal from the sensing lines RX1 through RXm. For example, the touch sensing driver 130 may monitor a change in the received sensing signal (e.g., decrease or other change in capacitance) to detect the touched position. The touch sensing driver 130 may adjust a converting gain value of the sensing signal or/and a touch threshold value of the sensing signal based on the second control signal CTL2 in order to improve accuracy of touch detection or touch sensitivity. The converting gain value may indicate, for example, an adjustment value to convert an analog sensing signal to a digital signal by an analog-digital converter (ADC) in the touch sensing driver 130. The touch threshold value of the sensing signal indicates a reference value for recognizing the converted digital sensing signal as a touch input.

The controller 150 may derive the sensing parameter based on a folding number of the touch panel 110 and may control the touch driver 120 and the touch sensing driver 130 based on the sensing parameter. As the number of folds or flexes (e.g., folding number) of the touch panel 110 increases, the line resistance of the driving lines TX1 through TXn and the sensing lines RX1 through RXm may increase or otherwise change. Accordingly, a touch input from an external electric conductor may not be detected or a touched position may not be accurately derived. Therefore, the controller 150 may adjust one or more factors (e.g., sensing parameter) for detecting the touch input corresponding to the folding number. This may improve reliability of the touch panel 110.

In one example embodiment, the sensing parameter may include at least one of a voltage of the driving signal, a frequency of the driving signal, a sequence data of the driving signal, a converting gain value of the sensing signal, or a touch threshold value of the sensing signal. The sensing parameter may be initialized based on characteristics (e.g., line resistances of driving line/sensing line and/or a parasitic capacitance) of the touch panel 110.

The controller 150 may provide the first control signal CTL1 to the touch driver 120 to increase the voltage of the driving signal as the resistance change value increases. The controller 150 may provide the first control signal CTL1 to the touch driver 120 to decrease the frequency of the driving signal as the resistance change value increases. The controller 150 may provide the first control signal CTL1 to the touch driver 120 to increase the number of driving lines in which the driving signal is simultaneously output as the resistance change value increases. In addition, the controller 150 may provide the second control signal CTL2 to the touch sensing driver 130 to adjust a converting gain value and/or a touch threshold value of the sensing signal based on the change in the driving signal.

The controller 150 may be implemented, for example, in a driving circuit for the touch screen device, a driving circuit for the display device, or an application processor in electronic device.

The touch screen device 100, therefore, may adjust one or more sensing parameters based on an accumulative folding number of the touch panel 110 in order to compensate a resistance change of the touch panel 110 and improve the lifespan of the touch panel 110.

Figure 2A:
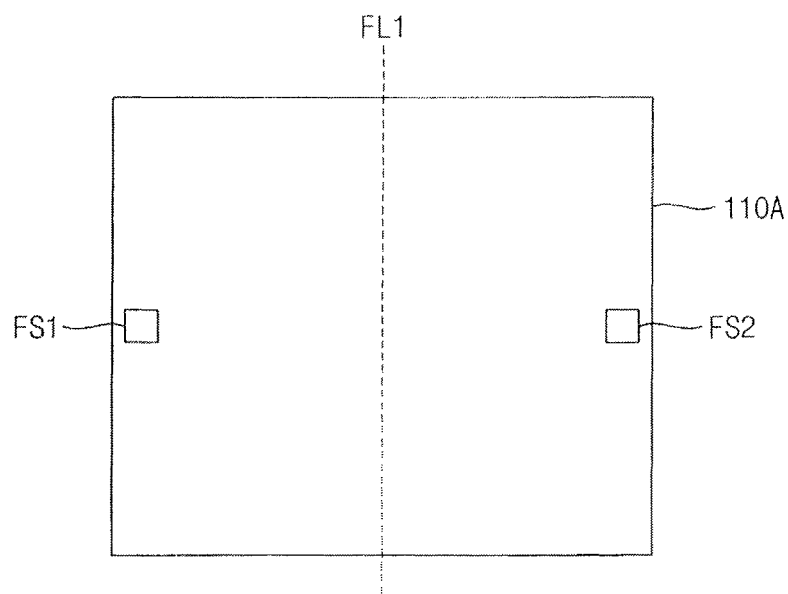
FIGS. 2A and 2B illustrate an embodiment of a touch panel and folding sensor.
Figure 2B:
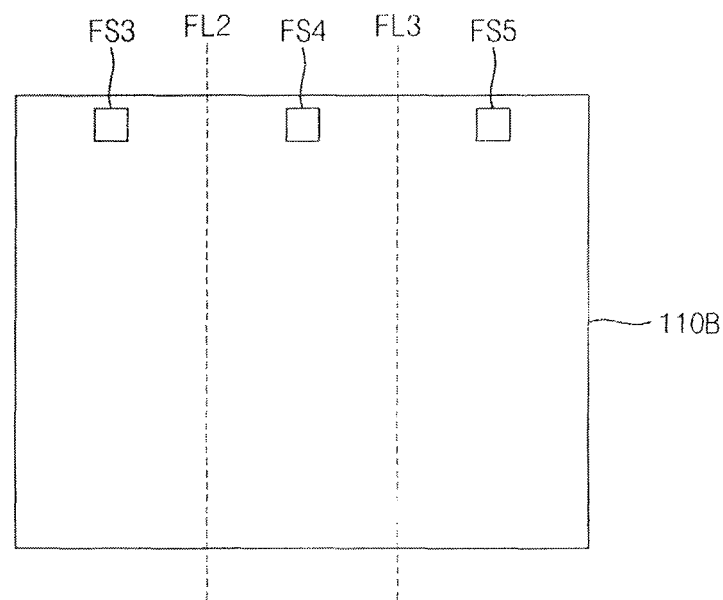

FIGS. 2A and 2B illustrate an embodiment of a touch panel and a folding sensor in a touch screen device, which, for example, may be the touch screen device of FIG. 1.

Referring to FIGS. 2A and 2B, the touch panel 110A/110B may be folded along at least one folding line. The folding sensors for sensing the folding state of the touch panel 110A/110B may be, for example, symmetrically arranged relative to the folding line. In one example embodiment, the folding sensor may be an acceleration sensor or a bending sensor for measuring a folding angle of the touch panel. For example, the folding sensor may be an acceleration sensor that measures the folding angle of the touch panel 110A/110B by setting virtual x, y, and z axes and detecting a gravity acceleration value that varies according to slopes of one or more of the virtual x, y, and z axes. In one embodiment, the folding sensor may be a bending sensor (e.g., fiber-optic bend sensors, pressure sensor, strain gauge) which measures the folding angle of the touch panel 110A/110B based on the resistance value that varies based on a degree of bending.

In one example embodiment, shown in FIG. 2A, the touch panel 110A may be folded along the first folding line FL1. A first folding sensor FS1 and a second folding sensor FS2 may be symmetrically disposed relative to the first folding line FL1 in order to measure the folding angle of the touch panel 110A. A cumulative sum of the folding angles measured by the first folding sensor FS1 and the second folding sensor FS2 may be detected in order to calculate the resistance change value.

In another example embodiment, shown in FIG. 2B, the touch panel 110B may be folded along the second folding line FL2 and the third folding line FL3. A third folding sensor FS3, a fourth folding sensor FS4, and a fifth folding sensor FS5 may be symmetrically disposed relative to the second folding line FL2 or the third folding line FL3 in order to measure the folding angle of the touch panel 110B. A cumulative sum of the folding angles measured by the third folding sensor FS3, the fourth folding sensor FS4, and the fifth folding sensor FS5 may be detected respectively or in integrated form in order to calculate the resistance change value.

FIGS. 2A and 2B illustrate that the folding sensor includes acceleration sensor or a bending sensor. In another embodiment, the folding sensor may include a combination of these or other sensors for measuring the folding angle.

Figure 3:
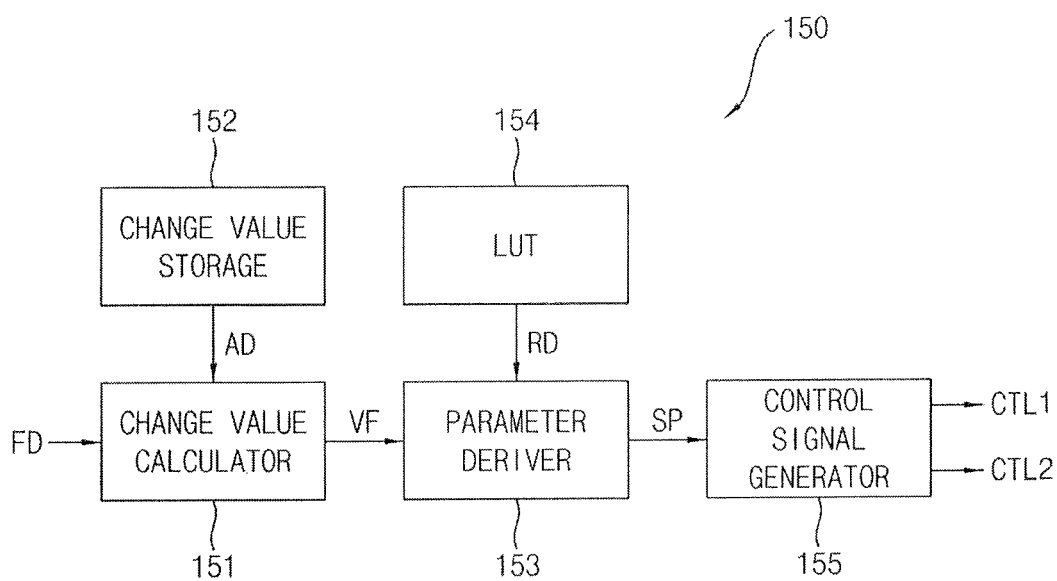
FIG. 3 illustrates an embodiment of a controller in a touch screen device.

FIG. 3 illustrates an embodiment of a controller in the touch screen device of FIG. 1. Referring to FIG. 3, the controller 150 may include a change value calculator 151, a change value storage 152, a parameter deriver 153, a look-up table (LUT) 154, and a control signal generator 155.

The change value calculator 151 may calculate a resistance change value based on the accumulative folding number of the touch panel. Thus, the change value calculator 151 may derive resistance change value by modeling the folding number and/or the folding angle. For example, the change value calculator 151 may convert the folding number of the touch panel into a resistance change value corresponding to a resistance change in the driving lines and sensing lines of the touch panel based on folding data FD from the folding sensor and accumulative data AD stored in the change value storage 152.

The change value calculator 151 may use the accumulative folding angle to calculate the resistance change value. In one embodiment, a weighted value may be applied to resistance change value. The weighted value may increase as the accumulative folding angle increases. In one example embodiment, the change value calculator 151 may derive a first resistance change value corresponding to the accumulative folding angle of the touch panel, and calculate the resistance change value VF by adding the first resistance change value and a second resistance change value accumulatively stored in the change value storage 152.

In another example embodiment, the change value calculator 151 may receive the folding data FD and store each folding number corresponding to each folding angle in the change value storage 152. Then, the change value calculator 151 may calculate the resistance change value VF by of applying a weighted value to each folding number (e.g., weighted sum).

The parameter deriver 153 may receive the resistance change value VF and derive the sensing parameter SP corresponding to the resistance change value VF. In one example embodiment, the sensing parameter SP may include at least one of a voltage of the driving signal, a frequency of the driving signal, a sequence data of the driving signal, a converting gain value of the sensing signal, and a touch threshold value of the sensing signal. For example, because the charging time of capacitance increases as the resistance change value VF increases, the voltage of the driving signal increases or the frequency of the driving signal decreases as the resistance change value increases. Also, the number of the driving lines in which the driving signal is simultaneously output increases as the resistance change value VF increases.

In one example embodiment, the parameter deriver 153 may derive the sensing parameter SP corresponding to the resistance change value VF using a look-up table (LUT) 154. The LUT 154 may indicate a relationship RD between the resistance change value VF and the sensing parameter SP. The LUT 154 may include a table indicating a relationship between the resistance change value VF and the sensing parameter SP. The parameter deriver 153 may update the sensing parameter SP at a predetermined period or at the time point in which a predetermined event occurs to reduce load of the touch screen device. For example, the parameter deriver 153 may update the sensing parameter SP every hour. The parameter deriver 153 may update the sensing parameter SP when the touch screen device is initialized.

In one example embodiment, the change value storage 152 and the LUT 154 may be implemented in one non-volatile memory device. The non-volatile memory device may maintain stored data even while power is not supplied. For example, the non-volatile memory device may include flash memory, erasable programmable read-only memory (EPROM), electrically erasable programmable read-only memory (EEPROM), phase change random access memory (PRAM), resistance random access memory (RRAM), nano floating gate memory (NFGM), polymer random access memory (PoRAM), magnetic random access memory (MRAM), ferroelectric random access memory (FRAM), etc.

The control signal generator 155 may generate a control signal for controlling the touch driver and the touch sensing driver based on the sensing parameter SP. For example, the control signal generator 155 may generate a first control signal CTL1 corresponding to the voltage of the driving signal, the frequency of the driving signal, the sequence data of the driving signal included in the sensing parameter SP. The control signal generator 155 may provide the first control signal CTL to the touch driver. The control signal generator 155 may generate a second control signal CTL2 corresponding to a converting gain value of the sensing signal and/or a touch threshold value of the sensing signal in the sensing parameter SP. The control signal generator 155 may provide the second control signal CTL2 to the touch sensing driver.

FIG. 3 illustrates that the change value storage 152 and LUT 154 are in the controller 500. In another embodiment, the change value storage 152 and the LUT 154 may be located outside of the controller 500.

Figure 4A:
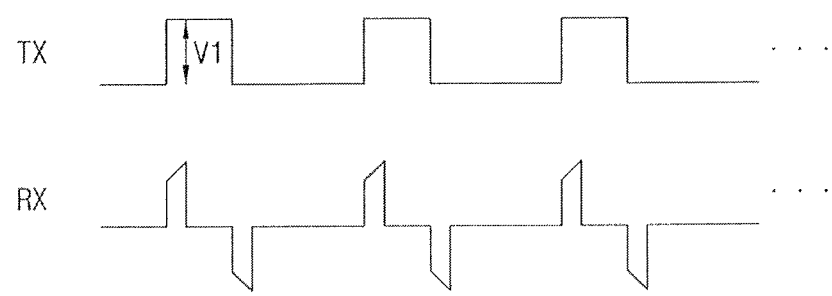
FIGS. 4A and 4B illustrate an embodiment for adjusting the voltage of a driving signal based on folding number.
Figure 4B:
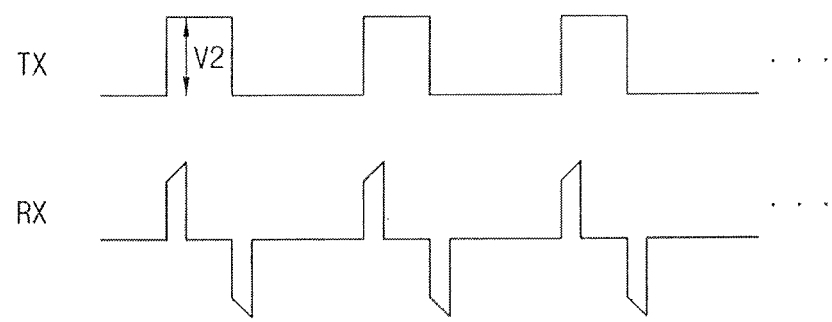

FIGS. 4A and 4B illustrate an embodiment for adjusting the voltage of a driving signal based on folding number. Referring to FIGS. 4A and 4B, the voltage of the driving signal may increase as an accumulative folding number increases. The resistance of driving lines and sensing lines may increase as the accumulative folding number increases. Also, the charging time of a capacitance at one or more crossing points of the driving lines and the sensing lines may increase as the resistance of the driving lines and the sensing lines increases. Therefore, the voltage of the driving signal may increase as the accumulative folding number increases in order to stably secure the charging time.

As shown in FIG. 4A, when the accumulative folding number is less than a threshold value, a pulse of the driving signal may have a first voltage level V1. As the voltage of the driving signal increases, temperature and power consumption of the touch screen device may increase. Therefore, the first voltage level V1 may be set to a predetermined (e.g., reduced or minimum) voltage level for stably securing the charging time of the capacitance.

As shown in FIG. 4B, when the accumulative folding number is greater than a threshold value, a pulse of the driving signal may have a second voltage level V2 greater than the first voltage level V1. The charging time of the capacitance may be reduced as the voltage of the driving signal increases. Therefore, to compensate characteristic changes of the touch panel based on resistance change, the voltage of the driving signal may increase in a predetermined manner (e.g., stepwise) as the accumulative folding number increases.

Figure 5A:
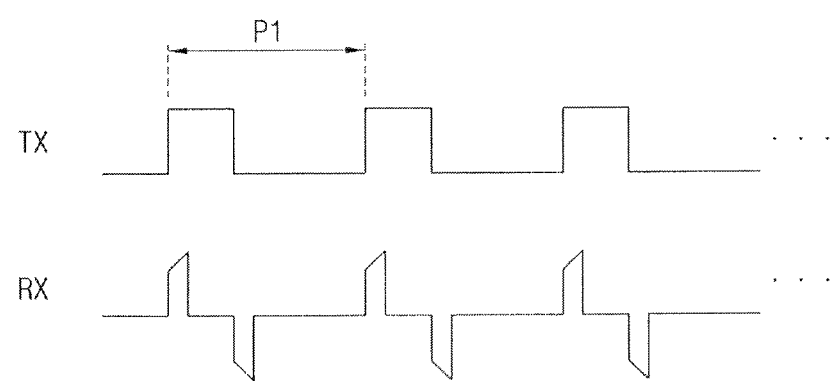
FIGS. 5A and 5B illustrate an embodiment for adjusting the frequency of a driving signal based on folding number.
Figure 5B:
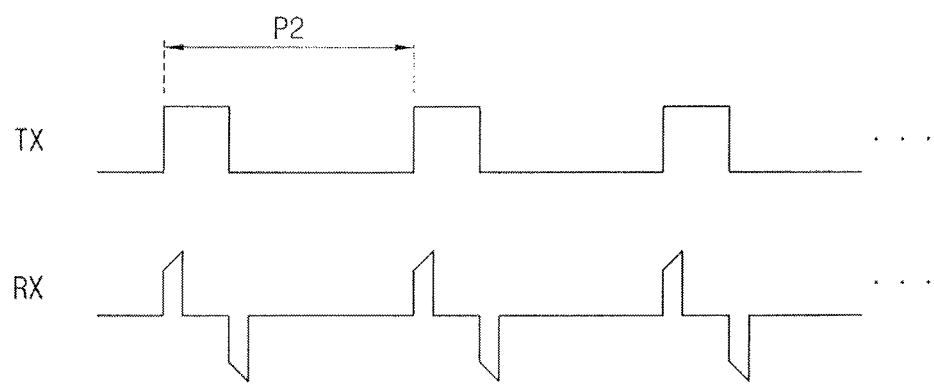

FIGS. 5A and 5B illustrate an embodiment for adjusting the frequency of a driving signal based on folding number. Referring to FIGS. 5A and 5B, the frequency of the driving signal may decrease as the accumulative folding number increases. The resistance of driving lines and sensing lines may increase as the accumulative folding number increases. Also, the charging time of capacitance at one or more crossing points of the driving lines and sensing lines may increase as resistance of the driving lines and the sensing lines increases. Therefore, the frequency of the driving signal may decrease as the accumulative folding number increases in order to stably secure charging time.

As shown in FIG. 5A, when the accumulative folding number is less than a threshold value, the driving signal may have a first period length P1. As the length of period of the driving signal increases, the response speed for detecting a touch input in the touch screen device may be reduced. Therefore, the first period length P1 may be set to a predetermined (e.g., reduced or minimum) time for stably securing the charging time of the capacitance.

As shown in FIG. 5B, when the accumulative folding number is greater than a threshold value, the driving signal may have a second period length P2 longer than the period length P1. The charging time of the capacitance may be stably secured as the length of period of the driving signal increases. Therefore, in order to compensate the characteristic change of touch panel based on resistance change, the period length of the driving signal may increase in a predetermined manner (e.g., stepwise) or the frequency of the driving signal decrease in a predetermined manner (e.g., stepwise) as the accumulative folding number increases.

Figure 6:
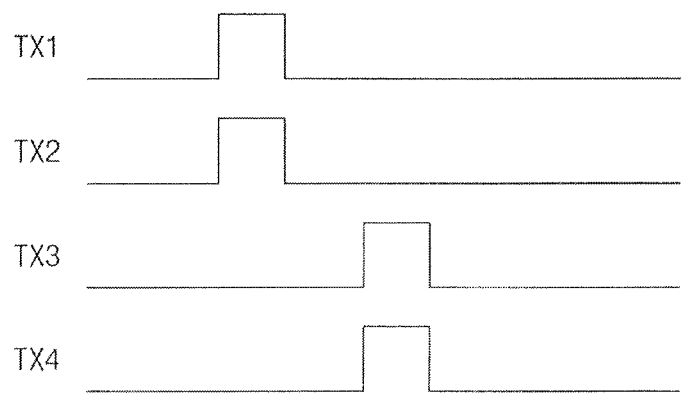
FIG. 6 illustrates an embodiment for adjusting the output sequence of a driving signal based on folding number.

FIG. 6 illustrates an embodiment for adjusting the output sequence of a driving signal based on folding number. Referring to FIG. 6, the sequence data of the driving signal may be adjusted based on an accumulative folding number. In one example embodiment, the number of the driving lines in which the driving signal is simultaneously output may increase as the resistance change value increases. For example, the driving signal may be simultaneously output to two driving lines as the resistance change value increases. When the driving signal is simultaneously output to a plurality of driving lines, a driving signal having a relatively high voltage may be provided to the driving lines due to a coupling effect and the charging time of the capacitance may be reduced. However, when the number of the driving lines in which the driving signal is simultaneously output increases, the sensing resolution of the touch panel may decrease. Therefore, the number of driving lines in which the driving signal is simultaneously output may be adjusted based on resistance change of the driving lines and the sensing lines.

FIGS. 4A, 4B, 5A, 5B, and 6 describe that the driving signal includes one pulse in one period. In another embodiment, the driving signal may include a plurality of pulses in one period. Also, FIGS. 4A, 4B, 5A, 5B, and 6 describe that one property of the sensing parameter is changed based on the accumulative folding number. In another embodiment, multiple properties of the sensing parameter may be changed based on the accumulative folding number. For example, the sequence data and voltage of the driving signal may be changed at the same time as the accumulative folding number increase.

Figure 7:
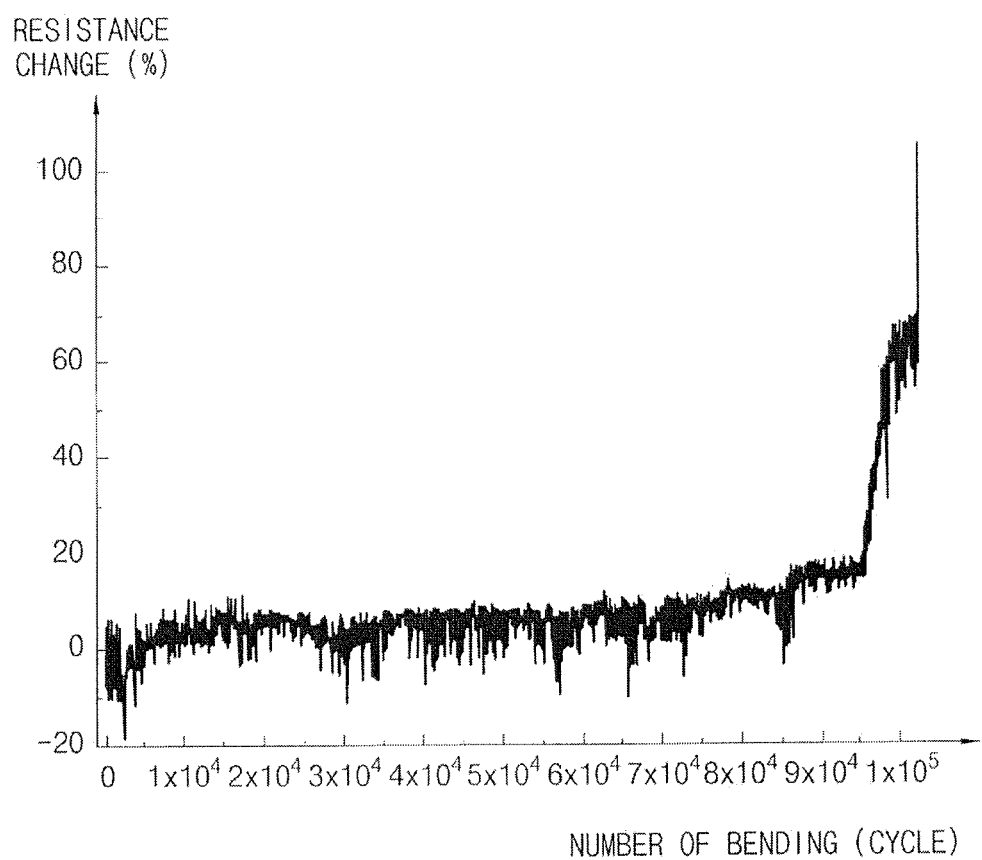
FIG. 7 illustrates an example of an effect of the touch screen device in FIG. 1.

FIG. 7 illustrates a graph of an example effect of the touch screen device of FIG. 1. Referring to FIG. 7, the resistance of the driving line and the sensing line may be changed as the accumulative folding number increases. In one embodiment, when driving line and sensing line of the touch panel include a silver nanowire (AgNW) and a line resistance of the driving line and the sensing line is about 150 ohm, the resistance of the driving line and the sensing line may increase as the accumulative folding number increases. In one case, the resistance change sharply increased when the accumulative folding number was over about 100,000. Accordingly, malfunction of the touch screen device occurred.

Therefore, the LUT, indicating a relationship between the resistance change value and the sensing parameter, may be set to compensate a resistance change of the touch panel based on the accumulative folding number. The LUT may store the relationship between the resistance change value and the sensing parameter in more detail in a range in which resistance sharply changes, thereby efficiently compensating the resistance change and increasing the lifespan of the touch panel.

Figure 8:
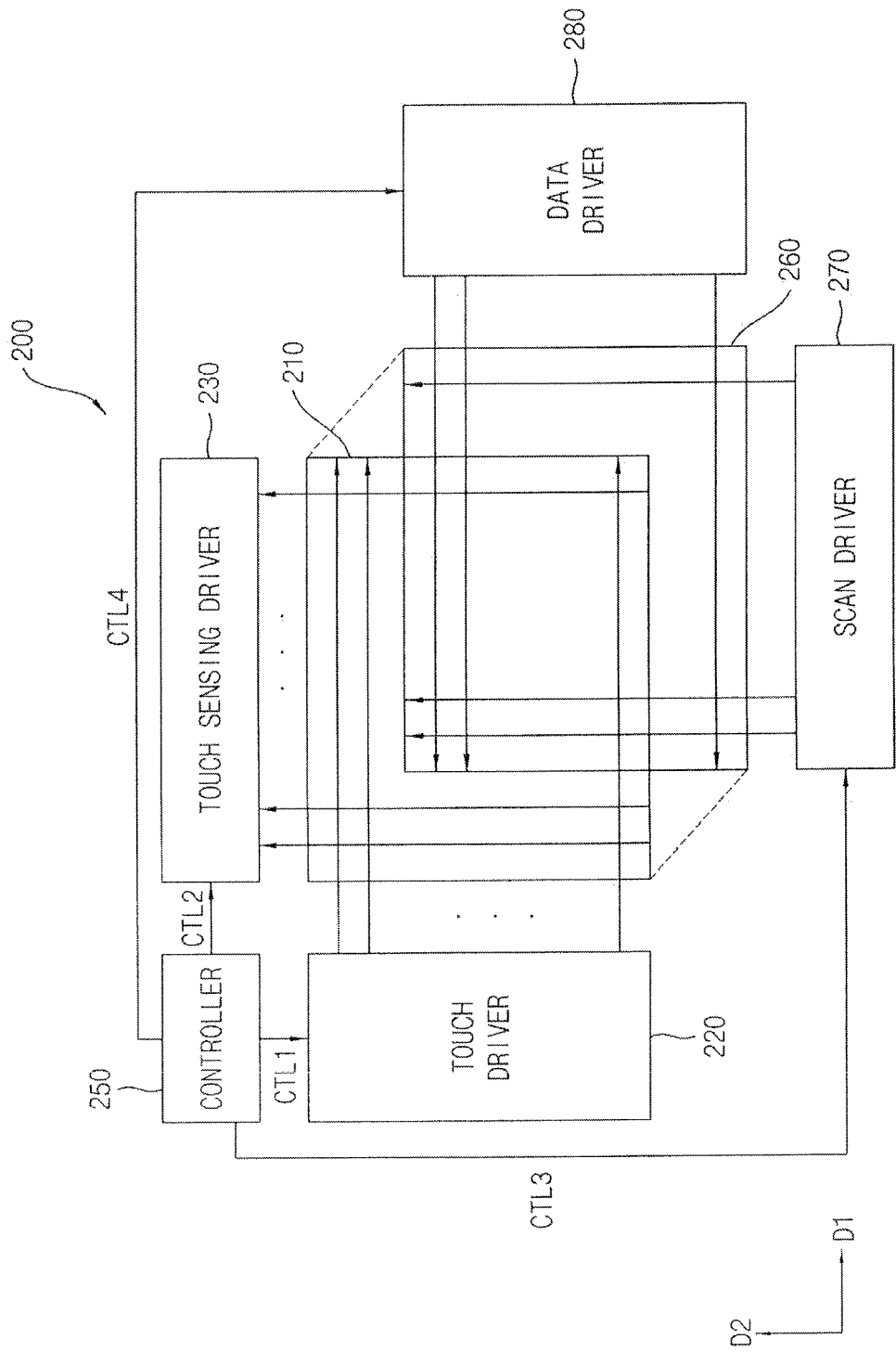
FIG. 8 illustrates an embodiment of a display device.

FIG. 8 illustrates an embodiment of a display device 200 which may include a touch panel 210, a touch driver 220, a touch sensing driver 230, a controller 250, a display panel 260, a scan driver 270, and a data driver 280. The touch screen device including touch panel 210, the touch driver 220, the touch sensing driver 230, and the controller 250 according to the present example embodiment is substantially the same as the touch screen device in FIG. 1, except that the touch screen device is bonded to the display device. The touch panel 210 may be bonded to one side of the display panel and may be foldable or flexible. The touch panel 210 may include a plurality of driving lines extending in a first direction D1 and a plurality of sensing lines extending in a second direction D2.

The touch driver 220 may output a driving signal to the driving lines. The touch sensing driver 230 may receive a sensing signal from the sensing lines. The display panel 260 may include a plurality of pixels. For example, the pixels may be arranged at locations corresponding to crossing points of the scan lines and the data lines. The display panel 260 may be a flexible display panel that folds or flexes.

The scan driver 270 may provide a scan signal to the pixels via the scan lines based on a third control signal CTL3. The data driver 280 may provide a data signal to the pixels via the data lines based on a fourth control signal CTL4.

The controller 250 may derive the sensing parameter corresponding to a folding number of the touch panel 210 and control the touch driver 220 and the touch sensing driver 230 based on the sensing parameter. The controller 250 may provide the first control signal CTL1 to the touch driver 220 so that the voltage of the driving signal increases or the frequency of the driving signal decreases as the resistance change value increases. The controller 250 may provide the second control signal CTL2 to the touch sensing driver 230 to convert a converting gain value and/or a touch threshold value of the sensing signal based on the change in the driving signal.

In addition, the controller 250 may provide a third control signal CTL3 including a vertical start signal, a clock signal, etc., to the scan driver 270. The controller 250 may provide a fourth control signal CTL4 including an image data, a horizontal start signal, a clock signal, etc., to the data driver 280. In one example embodiment, the controller 250 may control the drivers so that the touch panel 210 is driven in synchronization with the display panel 260. For example, the touch panel 210 may be driven in at least a portion of vertical blanking time period. Accordingly, the touch panel 210 may be not affected by the driving operation of the display panel 260. As a result, signal noise may be improved.

Therefore, the display device 200 may be foldable and may stably detect a touch input even though the touch panel is folded and unfolded a lot of times by including the touch screen device. FIG. 8 illustrates that the display drives the touch panel 210 and the display panel 260 uses one controller 250. In another embodiment, the display device may include a first controller for driving the touch panel and a second controller for driving the display panel.

Figure 9:
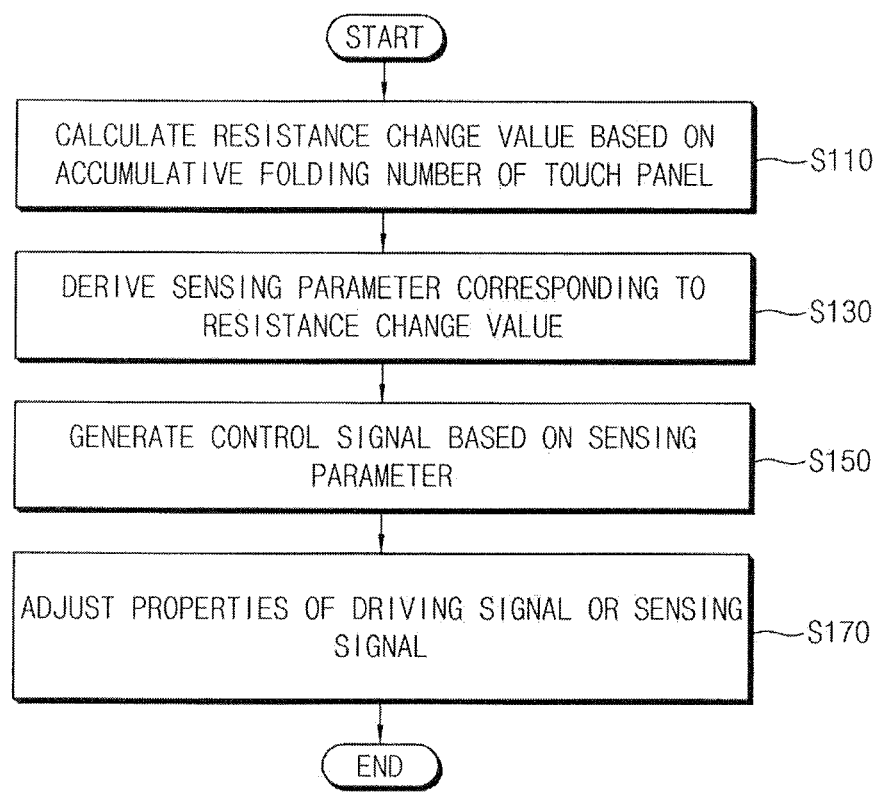
FIG. 9 illustrates an embodiment of a method for driving a touch screen device.

FIG. 9 illustrating a method for driving a touch screen device may adjust a sensing parameter based on folding number. This may improve reliability of the touch screen device and increase the lifespan of the touch panel.

A resistance change value may be calculated based on an accumulative folding number of the touch panel (S110). The touch screen device may be folded along at least one folding line. The resistance change value may be derived by modeling the folding number and/or the folding angle. In one example embodiment, the resistance change value may be calculated by an accumulative sum of folding angles of the touch panel.

The sensing parameter may be derived based on the resistance change value (S130). In one example embodiment, the sensing parameter may include at least one of a voltage of the driving signal, a frequency of the driving signal, a sequence data of the driving signal, a converting gain value of the sensing signal, or a touch threshold value of the sensing signal. For example, because the charging time of capacitance increases as the resistance change value increases, the voltage of the driving signal increases or the frequency of the driving signal decreases as the resistance change value increases.

In one example embodiment, the sensing parameter may be derived using a LUT indicating a relationship between the resistance change value and the sensing parameter. The LUT may include a table indicating a relationship between the resistance change value and the sensing parameter. In one example embodiment, the sensing parameter may be periodically updated. In another example embodiment, the sensing parameter may be updated at the time point in which a predetermined event occurs.

The control signal for controlling the touch driver and touch sensing driver may be generated based on the sensing parameter (S150). A first control signal corresponding to the voltage of the driving signal, the frequency of the driving signal, the sequence data of the driving signal in the sensing parameter may be generated The first control signal may be sent to the touch driver. A second control signal corresponding to a converting gain value of the sensing signal and/or a touch threshold value of the sensing signal may be generated. The second control signal may be sent to the touch sensing driver.

Properties of the driving signal or the sensing signal may be adjusted (S170). The touch driver may adjust the voltage or frequency of the driving signal based on the first control signal, in order to stably secure the charging time of capacitance of crossing points of the driving lines and the sensing lines. The touch sensing driver may adjust a converting gain value and/or a touch threshold value of the sensing signal based on the second control signal, in order to efficiently detect the change of the sensing signal.

Although example embodiments describe that the touch panel is a capacitive touch panel, the touch panel may be another type of touch panel in another embodiment.

The aforementioned embodiments may be applied to an electronic device having the touch screen device. Examples of the electronic device include a personal computer, a laptop, a cellular phone, a smart phone, a smart pad, and a personal digital assistant.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods described herein.

The controllers, drivers, generators, calculators, and other processing features of the disclosed embodiments may be implemented in logic which, for example, may include hardware, software, or both. When implemented at least partially in hardware, the controllers, drivers, generators, calculators, and other processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the controllers, drivers, generators, calculators, and other processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

Example embodiments have been disclosed herein, and although specific terms are employed, they are used and are to be interpreted in a generic and descriptive sense only and not for purpose of limitation. In some instances, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the embodiments set forth in the claims.

What is claimed is:

1. A touch screen device, comprising:
   a touch panel including a plurality of first signal lines extending in a first direction and a plurality of second signal lines extending in a second direction crossing the first direction;
   a touch sensing driver configured to detect a change in capacitance between the first and second signal lines; and
   a controller to determine a sensing parameter corresponding to an accumulative folding number of the touch panel, the accumulative folding number corresponding to the number of times the touch panel is folded, and to control at least one signal of the touch sensing driver based on the sensing parameter,
   wherein the controller calculates a resistance change value based on the accumulative folding number of the touch panel, derives the sensing parameter corresponding to the resistance change value, and generates a control signal for controlling the touch sensing driver based on the sensing parameter.

2. The touch screen device as claimed in claim 1, wherein the sensing parameter includes at least one selected from a converting gain value of at least one of sensing signals, and a touch threshold value of at least one of the sensing signals.

3. The touch screen device as claimed in claim 1, further comprising one or more folding sensors to sense a folding state of the touch panel.

4. The touch screen device as claimed in claim 3, wherein:
   the touch panel is folded along at least one folding line, and
   the folding sensors are symmetrically disposed relative to the folding line.

5. The touch screen device as claimed in claim 3, wherein the folding sensor is an acceleration sensor to measure a folding angle of the touch panel.

6. A display device, comprising:
   a display panel including a plurality of pixels;
   a touch panel bonded to one side of the display panel, the touch panel including a plurality of first signal lines extending in a first direction and a plurality of second signal lines extending in a second direction crossing the first direction;
   a scan driver to provide a scan signal to the pixels;
   a data driver to provide a data signal to the pixels;
   a touch sensing driver configured to detect a change in capacitance between the first and second signal lines; and
   a controller to determine a sensing parameter corresponding to an accumulative folding number of the touch panel, the accumulative folding number corresponding to the number of times the touch panel is folded, and to control at least one signal of the touch sensing driver based on the sensing parameter,
   wherein the controller calculates a resistance change value based on the accumulative folding number of the touch panel, derives the sensing parameter corresponding to the resistance change value, and generates a control signal for controlling the touch sensing driver based on the sensing parameter.

7. The display device as claimed in claim 6, wherein the sensing parameter includes at least one selected from a converting gain value of at least one of sensing signals, and a touch threshold value of at least one of the sensing signals.

8. A method for driving a touch screen device folded in at least one folding line, the method comprising:
   calculating a resistance change value based on an accumulative folding number of a touch panel, the accumulative folding number corresponding to the number of times the touch panel is folded;
   determining a sensing parameter corresponding to the resistance change value; and
   generating a control signal to control at least one signal of a touch sensing driver receiving a sensing signal for sensing a touch of the touch panel based on the sensing parameter,
   wherein the sensing parameter includes at least one selected from a converting gain value of the sensing signal and a touch threshold value of the sensing signal.

9. The method as claimed in claim 8, further comprising:
   determining the sensing parameter using a look-up table (LUT),
   wherein the LUT indicates a relationship between the resistance change value and the sensing parameter.

10. The method as claimed in claim 8, further comprising periodically updating the sensing parameter.

* * * * *